United States Patent [19]

Reay et al.

[11] Patent Number: 5,600,174
[45] Date of Patent: Feb. 4, 1997

[54] SUSPENDED SINGLE CRYSTAL SILICON STRUCTURES AND METHOD OF MAKING SAME

[75] Inventors: Richard J. Reay, Palo Alto; Erno H. Klaassen, San Jose, both of Calif.

[73] Assignee: The Board of Trustees of the Leeland Stanford Junior University, Palo Alto, Calif.

[21] Appl. No.: 321,299

[22] Filed: Oct. 11, 1994

[51] Int. Cl.$^6$ .......................... H01L 31/058; H01L 29/06
[52] U.S. Cl. .......................... 257/467; 257/401; 257/470; 257/577; 257/622
[58] Field of Search .......................... 257/467, 468, 257/469, 470, 415, 420, 401, 577, 622

[56] References Cited

U.S. PATENT DOCUMENTS

| | | | |
|---|---|---|---|
| 3,758,830 | 9/1973 | Jackson | 257/467 |
| 3,881,181 | 4/1975 | Khajezadeh | 257/467 |
| 4,478,077 | 12/1984 | Bohrer et al. | 257/467 |
| 5,300,915 | 4/1994 | Higashi et al. | 257/467 |
| 5,369,280 | 11/1994 | Liddiard | 257/467 |
| 5,374,123 | 12/1994 | Bu | 257/467 |

*Primary Examiner*—Ngân V. Ngô
*Attorney, Agent, or Firm*—Dale Curtis Hogue, Sr.

[57] ABSTRACT

Temperature-sensitive transducers and other circuitry are manufactured by an electrochemical post-processing etch on an integrated circuit fabricated using a conventional CMOS process. Tetramethyl ammonium hydroxide or another anisotropic etchant having similar characterisics is used to selectively etch exposed front-side regions of a p-type silicon substrate, leaving n-type wells suspended from oxide beams. Circuits in the n-wells are thermally and electrically insulated from the substrate.

9 Claims, 6 Drawing Sheets

SUSPENDED SINGLE CRYSTAL SILICON STRUCTURES AND METHOD OF MAKING SAME

BACKGROUND OF THE INVENTION

1. Field of the Invention

The present invention relates to suspended single crystal silicon structures micromachined in a standard CMOS integrated circuit process, and the micromachining method itself. More specifically, the invention relates to suspended single crystal silicon structures useful as temperature sensitive transducers and as low-power temperature-controlled circuitry; and to a method of micromachining an integrated circuit without the need for additional masking layers using an electrochemical post-processing etch.

2. Related Art

There are many types of transducers, such as vacuum sensors, gas flow sensors, infrared detectors, and AC power converters, which operate based on the detection of a localized temperature difference in an integrated circuit context. Examples of these transducers are given in Y. Xu, R. Huang, and G. Rigby, "A Silicon-Diode-Based Infrared Thermal Detector Array," *Sensors and Actuators A*, Vols. 37–38, pp. 226–30 (1993); H. Baltes and D. Moser, "CMOS Vacuum Sensors and Other Applications of CMOS Thermopiles," Transducers '93 Dig. Tech. Papers pp. 736,41 (New York 1993); D. Jaeggl, H. Baltes, and D. Moser, "Thermoelectric AC Power Sensor by CMOS Technology," *IEEE Electron Device Letters*, Vol. 13, No. 7, pp. 366–68 (1992); A. van Herwaarden D. van Duyn, B. Oudheusden, and P. Sarro, "Integrated Thermopile Sensors," *Sensors and Actuators A*, vol. 21–23, pp. 623–30 (1989); J. Choi and K. Wise, "A Silicon-Thermopile-Based Infrared Sensing Array for Use in Automated Manufacturing," *IEEE Trans. Electron Devices*, Vol. ED-33, No. 1, pp. 7–79 (1986); and D. Moser, R. Lenggenhager, and H. Baltes, "Silicon Gas Flow Sensors Using Industrial CMOS and Bipolar IC Technology," *Sensors and Actuators A*, Vols. 25–27, pp. 577–81 (1991). These transducers benefit from the temperature sensor having good thermal isolation, high temperature sensitivity, and small thermal mass.

There are various ways to measure temperature in an integrated circuit process. The first is through the use of thermopiles. Thermopiles are series of junctions between dissimilar materials which develop a voltage across them proportional to a temperature gradient. As described in D. Jaeggl, H. Baltes, and D. Moser, "Thermoelectric AC Power Sensor by CMOS Technology," two such dissimilar materials used in circuit processing are aluminum and polysilicon, which have a temperature sensitivity of around 60 µV/°C. per junction.

Another way to measure temperature is to exploit the temperature dependence of the forward voltage drop across a diode, which is 2000 µV/°C. This second method detects absolute temperature, and not strictly a temperature gradient.

For sensitive temperature transduction, the sensor needs to be thermally isolated from the rest of the silicon substrate. One way to provide such thermal isolation has been to create CMOS or bipolar compatible thermal transducers using post-processing techniques, as described in J. Suehle, R. Cavicci, M. Gaitan, and S. Semancik, "Tin Oxide Gas Sensor Fabricated Using CMOS Micro-Hotplates and In-situ Processing," *IEEE Electron Device Letters*, Vol. 14, No. 3, pp. 118–20 (1993); Y. Xu, R. Huang, and G. Rigby, "A Silicon-Diode-Based Infrared Thermal Detector Array," *Sensors and Actuators A*, Vols. 37–38, pp. 226–30 (1993); H. Baltes and D. Moser, "CMOS Vacuum Sensors and Other Applications of CMOS Thermopiles," Transducers '93 Dig. Tech. Papers pp. 736,41 (New York 1993); D. Jaeggl, H. Baltes, and D. Moser, "Thermoelectric AC Power Sensor by CMOS Technology," *IEEE Electron Device Letters*, Vol. 13, No. 7, pp. 366–68 (1992); A. van Herwaarden D. van Duyn, B. Oudheusden, and P. Sarro, "Integrated Thermopile Sensors," *Sensors and Actuators A*, vol. 21–23, pp. 623–30 (1989); N. Swan, A. Nathan, M. Sharns, and M. Parameswaran, "Numerical Optimisation of Flow-Rate Microsensors Using Circuit Simulation Tools," *Transducers '91 Dig. Tech. Papers*, pp. 26–29 (New York 1991); and M. Parameswaran, H. Baltes, L. Ristic, A. Dhaded, and A. Robinson, "A New Approach for the Fabrication of Micromechanical Structures," *Sensors and Actuators*, Vol. 10, pp. 289–307. These devices are either realized with suspended oxide membranes, as described in J. Suehle, R. Cavicci, M. Gaitan, and S. Semancik, "Tin Oxide Gas Sensor Fabricated Using CMOS Micro-Hotplates and In-situ Processing", *IEEE Electron Device Letters*, Vol. 14, No. 3, pp. 118–20 (1993), or cantilever-style single crystal silicon structures, as described in Y. Xu, R. Huang, and G. Rigby, "A Silicon-Diode-Based Infrared Thermal Detector Array," *Sensors and Actuators A*, Vols. 37–38, pp. 226–30 (1993).

J. Suehle, R. Cavicci, M. Gaitan, and S. Semancik, "Tin Oxide Gas Sensor Fabricated Using CMOS Micro-Hotplates and In-site Processing," *IEEE Electron Device Letters*, Vol. 14, No. 3, pp. 118–20 (1993); Y. Xu, R. Huang, and G. Rigby, "A Silicon-Diode-Based Infrared Thermal Detector Array," *Sensors and Actuators A*, Vols. 37–38, pp. 226–30 (1993); H. Baltes and D. Moser, "CMOS Vacuum Sensors and Other Applications of CMOS Thermopiles," *Transducers '93 Dig. Tech. Papers* pp. 736,41 (New York 1993); D. Jaeggl, H. Baltes, and D. Moser, "Thermoelectric AC Power Sensor by CMOS Technology," *IEEE Electron Device Letters*, Vol. 13, No. 7, pp. 366–68 (1992); A. van Herwaarden D. van Duyn, B. Oudheusden, and P. Sarro, "Integrated Thermopile Sensors," *Sensors and Actuators A*, vol. 21–23, pp. 623–30 (1989); and I. Choi and K. Wise, "A Silicon Thermopile-Based Infrared Sensing Array For Use In Automated Manufacturing," *IEEE Trans. Electron Devices*, Vol. ED-33, No. 1, pp. 72–79 (1986) disclose that the thermally isolated structures can sense a localized change in temperature, making them useful for applications such as infrared detection, gas flow monitoring, and AC power measurement. While oxide membranes are useful for building thermopiles and polysilicon heating resistors, they do not allow for the formation of active devices such as diodes or transistors. Silicon cantilevers, while providing diodes for highly sensitive temperature transducers, are connected to the substrate with low thermal resistance single crystal silicon. Moreover, the processes used for the fabrication of these cantilevers either are not CMOS compatible (Y. Xu, R. Huang, and G. Rigby, "A Silicon-Diode-Based Infrared Thermal Detector Array," *Sensors and Actuators A*, Vols. 37–38, pp. 226–30 (1993) or require backside alignment (A. van Herwaarden, D. van Duyn, B. Oudheusden, and P. Sarro, "Integrated Thermopile Sensors," *Sensors and Actuators A*, vol. 21–23, pp. 623–30 (1989)). In either case protection of the metalization layers is required during the electrochemical etch.

A related problem is the provision of a voltage reference that is stable over temperature variation. Such a voltage reference is an important component of most data acquisition systems. Examples are described in T. Brooks et al., "A Low-Power Differential CMOS Bandgap Reference," *ISSCC Digest of Technical Papers*, pp. 248–49 (February 1994); and M. Ferro et al., "A Floating CMOS Bandgap Voltage Reference for Differential Applications," *IEEE J. Solid-State Circuits*, Vol. 24, pp. 690–97 (June 1989). Improved stability has been achieved through bandgap curvature compensation techniques and by regulating the temperature of a zener diode reference with an on-chip heater. The "LTZ1000 data sheet," Linear Technology Corporation, Milpitas, Cal.; R. Dobkin, "Monolithic Temperature Stabilized Voltage Reference with 0.5 ppm/° Drift," *ISSCC Digest of Technical Papers*, pp. 108–09 (February 1976); and D. Laude et al., "5V Temperature Regulated Voltage Reference," *IEEE J. Solid-State Circuits*, Vol. 15, pp. 1070–1075 (December 1980) describe achieving very stable performance, ranging from 0.3 ppm/°C. down to 0.05 ppm/°C., using the heated substrate method. The disadvantages of this approach have been high power consumption (up to 800 mW), slow warm-up time (3 seconds) and specialized non-CMOS processes. It is to the solution of this problem and those described above to which the present invention is directed.

SUMMARY OF THE INVENTION

It is therefore a primary object of the present invention to provide a transducer based on the detection of a localized temperature difference, such as vacuum sensors, gas flow sensors, infrared detectors, and AC power converters, in which the sensor needs to be thermally isolated from the rest of the silicon substrate.

It is another object of the present invention to provide a thermally-isolated sensor which is useful for building thermopiles and polysilicon heating resistors, and which allows for the formation of active devices such as diodes or transistors. It is another object of the present invention to provide a thermally-isolated sensor which is CMOS compatible and does not require backside alignment.

It is still another object of the present invention to provide a voltage reference that is stable over temperature variation, has relatively low power consumption and fast warm-up time, and does not require specialized non-CMOS processes.

In contrast to previous work, the present invention provides for the manufacture of temperature-sensitive transducers through a technique consisting of an electrochemical post-processing etch on an integrated circuit (IC) with exposed metalization fabricated using a CMOS process. The etch can be performed on silicon wafers containing circuitry or on packaged and bonded IC's. Tetramethyl ammonium hydroxide (TMAH), or another anisotropic etchant with similar characteristics, is used to selectively etch exposed front-side regions of a p-type silicon substrate, leaving n-type wells ("n-wells") suspended from oxide beams. Circuits in these n-wells are thermally and electrically insulated from the substrate. This technique combines the advantages of the oxide membrane and silicon cantilever methods by providing the high thermal isolation of oxide beams and the excellent sensitivity of silicon diode temperature sensors. The etchant in this process is also safer, more easily handled and less corrosive to the aluminum bond pads than ethylene diamine pyrocatechol (EDP), which is commonly used for CMOS compatible anisotropic silicon etching. Since no special processing steps, masks or materials are needed, this process provides for simple, cost-effective prototyping and production of integrated sensor systems.

Another new application for suspended single crystal silicon structures is low-power temperature regulated circuitry. By placing circuits in the suspended region along with a heater and temperature sensor, the circuitry can be held at a constant, regulated temperature. Temperature regulation can reduce any effects of ambient temperature changes on precision electronics such as voltage references. There are examples of temperature regulation of an entire silicon die (see R. Dobkin, "Monolithic Temperature Stabilized Voltage Reference with 0.5 ppm/° Drift," *ISSCC Digest of Technical Papers.*, pp. 108–09 (February 1976)), but regulating thermally isolated structures consumes much less power.

In one aspect of the invention, a temperature regulated bandgap voltage reference is fabricated in a CMOS process. Using a simple post-processing micromachining step, a small portion of the chip containing the reference circuitry is thermally isolated from the rest of the silicon die. With the high thermal resistance and small thermal mass provided by this technique, the reference requires substantially less power and warms up substantially faster than previous heated-substrate circuits. The specific amount of improvement varies depending upon how the isolated structure is designed, but in one design, the reference requires 200 times less power and warms up 150 times faster than previous heated-substrate circuits.

Since the reference is fabricated in a standard CMOS process, it can be included on-chip with CMOS data converters and mixed signal products, providing a stable, low-power voltage reference.

BRIEF DESCRIPTION OF THE DRAWINGS

The invention is better understood by reading the following Detailed Description of the Preferred Embodiments with reference to the accompanying drawing figures, in which like reference numerals refer to like elements throughout, and in which.

DETAILED DESCRIPTION OF THE PREFERRED EMBODIMENTS

In describing preferred embodiments of the present invention illustrated in the drawings, specific terminology is employed for the sake of clarity. However, the invention is not intended to be limited to the specific terminology so selected, and it is to be understood that each specific element includes all technical equivalents which operate in a similar manner to accomplish a similar purpose.

Figure 1:
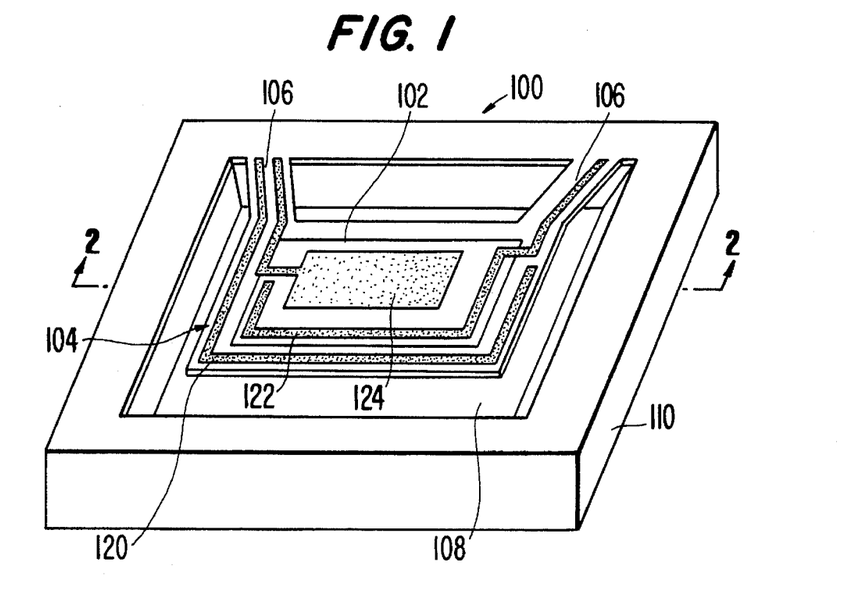
FIG. 1 is a schematic perspective view of an n-well containing a single vertical bipolar transistor in accordance with the invention.
Figure 2:
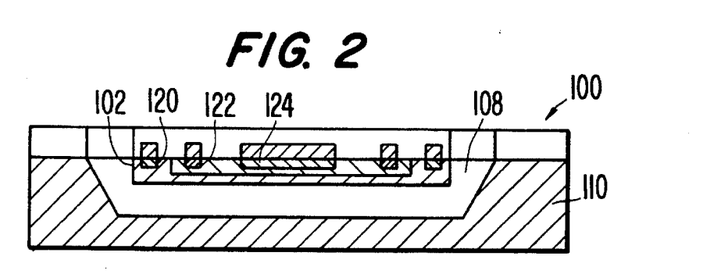
FIG. 2 is a schematic cross-sectional view of the transistor of FIG. 1, taken along line 2—2 of FIG. 1.

The parts used in the manufacture of a thermal transducer in accordance with the present invention can be fabricated in a CMOS process. Regions of bare silicon are exposed by superimposing dielectric cuts in the layout file. Different device structures can be fabricated. A first device 100, shown in FIGS. 1 and 2, comprises an n-well 102 containing a single vertical bipolar transistor 104 suspended by dielectric beams 106 over a pit 108 etched in a p-substrate 110. Transistor 104 conventionally includes a collector 120, a base 122, and an emitter 124.

Figure 3:
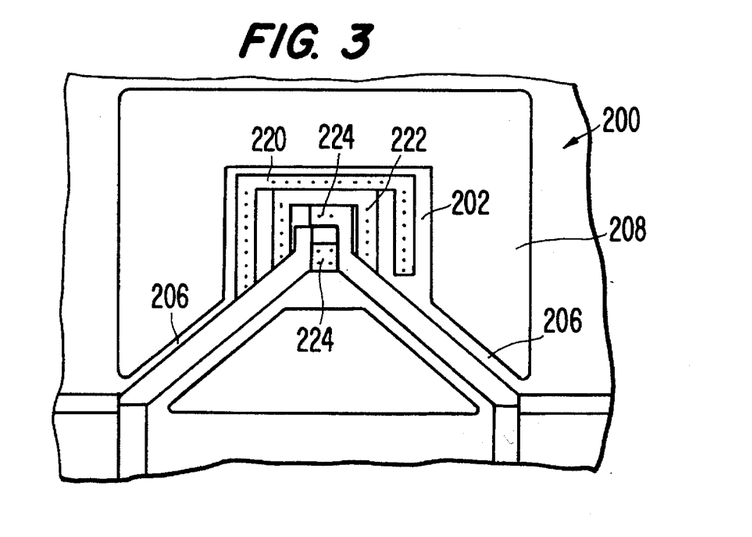
FIG. 3 is an elevational view of two ratioed bipolar junction transistors inside a suspended n-well, in accordance with the invention.

A second device 200, shown in FIG. 3, comprises a pair of ratioed vertical bipolar transistors inside an n-well 202 suspended by dielectric beams 206 over an etched pit 208. The bipolar transistors include common collector contacts 220, common base contacts 222, and separate emitter contacts 224.

Figure 4:
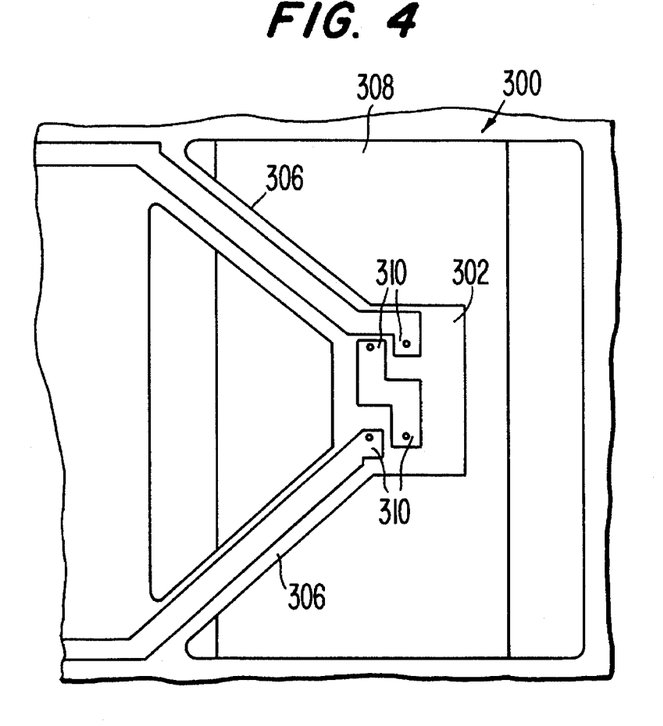
FIG. 4 is an elevational view of two series pn diodes inside two suspended n-wells in accordance with the invention.

A third device 300, shown in FIG. 4, comprises two series-connected diodes in two closely spaced n-wells 302 suspended by dielectric beams 306 over an etched pit 308. The diodes include contacts 310.

As illustrated in FIG. 3 and FIG. 4, the suspended n-wells 202 and 302 are visible underneath the oxide membrane. In the device of FIG. 3, the collector contacts 220 form a guard ring which acts to prevent etching at the corners of the n-well. The thin region of p-silicon between the two n-wells 302 in FIG. 4 is not etched away due to an etching phenomenon.

Prior to micromachining in accordance with the invention, the circuitry is fabricated through any conventional CMOS (with n-wells) process. The parts are provided with regions of exposed silicon substrate by creating a stack of several oxide holes, for example as described in M. Parameswaran, H. Baltes, L. Ristic, A. Dhaded, and A. Robinson, "A New Approach for the Fabrication of Micromechanical Structures," *Sensors and Actuators*, Vol. 10, pp. 289–307.

Figure 12A:
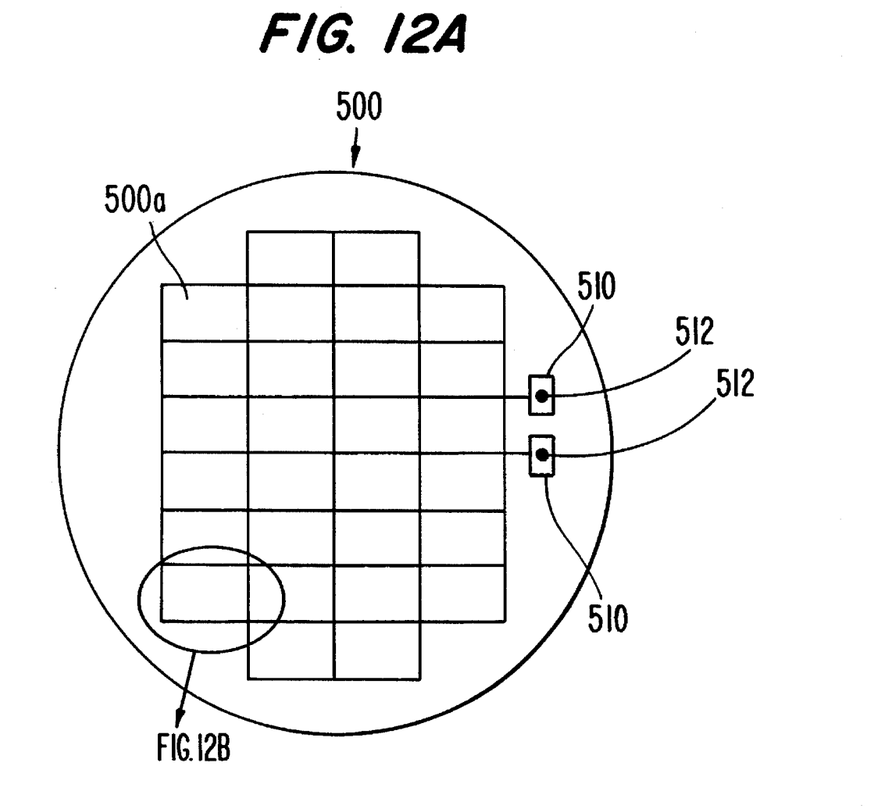
FIG. 12A is a schematic plan view of a silicon wafer prepared for etching in accordance with the invention.
Figure 12B:
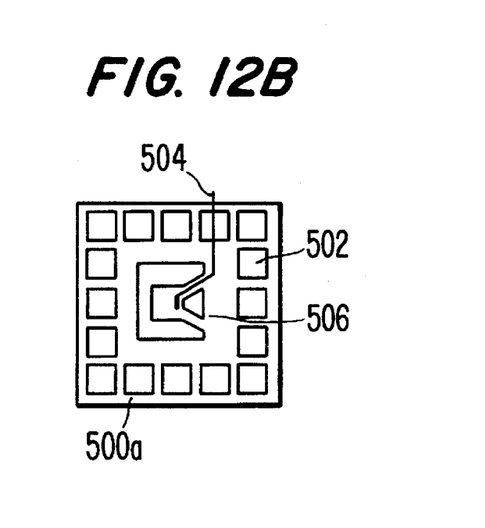
FIG. 12B is an enlargement of the area enclosed by the dashed line in FIG. 12A.

In accordance with the invention, electrical contacts for biasing the n-wells and p-substrate during the etching are made by connecting Teflon™ coated wires to the appropriate package pins for a packaged part, or by connecting wires to metallized regions on a wafer, as shown in FIGS. 12A and 12B. Without using any protective material, such as wax or epoxy, the package or wafer is then submerged in TMAH, or another anisotropic etchant with similar characteristics. TMAH, a photo-resist developer, is a safe, CMOS compatible silicon etchant that, when doped with silicon will not attack aluminum; it also etches oxide very slowly, making it possible to perform the etching at the end of the processing. The dielectric beams of FIGS. 3 and 4 are constructed by leaving a protective oxide layer at the locations where the beams are desired. The n-well is biased at 0.8 V above the p-substrate using a laboratory power supply. The potential between the substrate and the etching solution is maintained at −1.6 V with a potentiostat, using a platinum counter electrode and a silver/silver chloride reference electrode.

Referring to FIGS. 12A and 12B, there is shown a silicon wafer 500, comprising a plurality of individual silicon dice 500a. In the case where the structure is fabricated using a wafer 500, each die 500a is provided with a plurality of bond pads 502 and an interconnect trace 504 for biasing the n-well in order to create an isolated structure 506. In addition, the wafer 500 is provided with bond pads 510 for connecting wafer 500 to external circuitry (not shown) via external wires 512 during the electrochemical etch step.

To fabricate structures as shown in FIGS. 3 and 4, the etchant used was 10 wt. % TMAH doped with 32 g/l of dissolved silicon. The dissolved silicon adjusts the pH of the solution such that it does not etch the exposed aluminum. The etching solution was kept at 85° C. and covered with a reflux condenser to keep the concentration of the etchant constant. In an experimental trial of the technique, the TMAH did not noticeably attack the exposed passivation layer, bond pads or bond wires during the six hour etch required to undercut the n-well structures.

The thermal characteristics of the ratioed bipolar transistor structure of FIG. 3 were measured in air by using one of the two transistors as a temperature sensor and the other as a heater. To sense the temperature, a constant current of 2 μA was passed through the diode-connected sense transistor and the voltage across it was measured. The thermal resistance of the experimental structure was measured to be 16.7 K/mW, which is relatively low due to the short oxide beams used for isolation. This value is close to the simulated value of 15.2 K/mW, which was calculated using a simple thermal model. Devices in accordance with the invention fabricated with longer isolation beams will have a much higher thermal resistance. The sensitivity of the detector with respect to temperature was measured to be 1.98 mV/K, giving a total responsivity of 30.4 V/W. The measured thermal time constant was 1.4 ms.

The DC device characteristics of the transistors in the suspended n-wells were measured before and after the etch. The characteristics were not noticeably altered by the etching process. Beta for the transistors was nominally 70, which is typical for minimum sized npn transistors in the CMOS process.

The performance of thermally isolated silicon diode sensors should be significantly better than traditional thermopile based structures for several reasons. The voltage output for a given change in temperature is 1980 μV/K for a pn junction sensor, compared to 58 μV/K for an aluminum/polysilicon thermocouple; and 319 μV/K for a n-polysilicon/p-polysilicon thermocouple. Another advantage is that pn junctions can be stacked in series without the additional interconnects to the substrate that are necessary for thermocouple based sensors (FIG. 4). These extra interconnects decrease the sensitivity of thermopile detectors by increasing the thermal conductance to the substrate. Additionally, a high Seebeck coefficient in polysilicon thermopiles is coupled with a large ohmic resistance which leads to high Johnson noise. The noise in a pn junction detector is dominated by shot noise, the effect of which on the signal can be more than an order of magnitude lower than the noise in a polysilicon thermopile.

Figure 5:
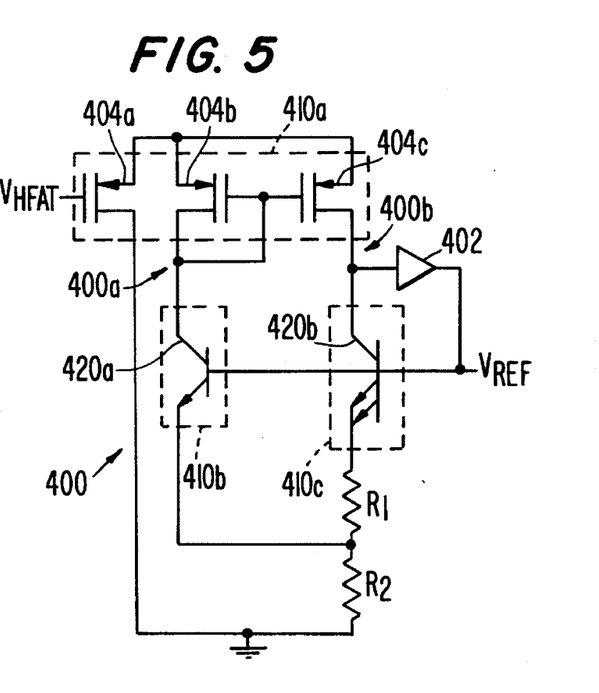
FIG. 5 is a schematic circuit diagram of a bandgap reference core in accordance another embodiment of the invention.

Referring now to FIG. 5, there is shown a schematic of a bandgap reference core 400 in accordance the invention. The circuit 400 illustrated is a Brokaw cell designed for a CMOS process with vertical npn transistors available in n-wells. A servo amplifier 402 adjusts the reference voltage $V_{REF}$ until the currents in the two branches 400a and 400b of the Brokaw cell 400 are equal, thus generating a relatively stable output voltage. A first PMOS transistor 404a, connected between the positive voltage supply and ground, acts as a voltage-controlled heater. Second and third PMOS transistors 404b and 404c together form a current mirror, and are inside a first n-well 410a with PMOS transistor 404a. Transistors 420a and 420b are inside second and third n-wells 410b and 410c, respectively. The three n-wells 410a–c are thermally coupled to each other. The resistors $R_1$ and $R_2$ are implemented on-chip with polysilicon and are also thermally coupled to the n-wells 410a–c by being in close proximity thereto.

Figure 6:
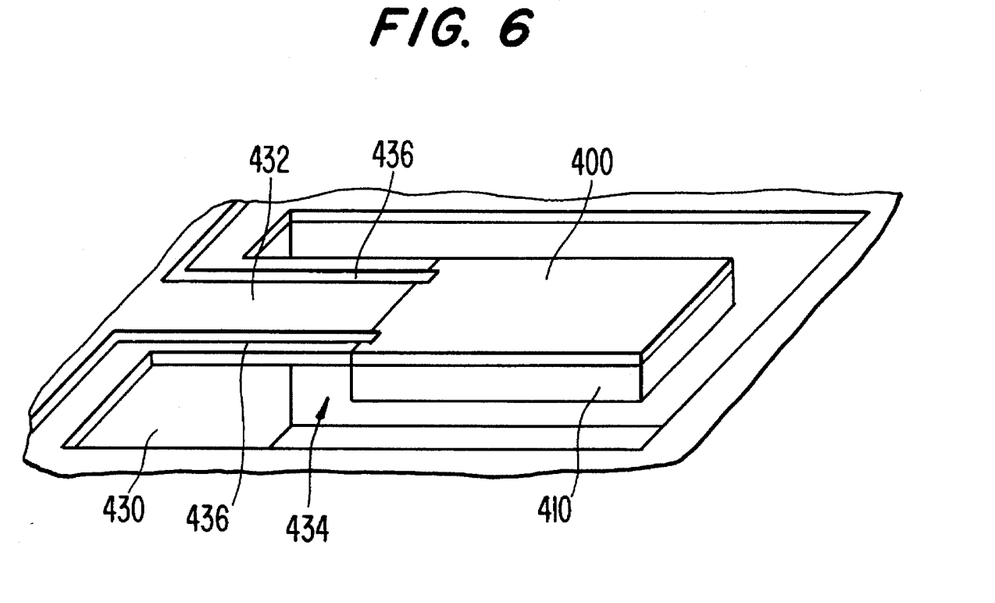
FIG. 6 is a schematic perspective view of a suspended n-well structure for a bandgap reference core.
Figure 7:
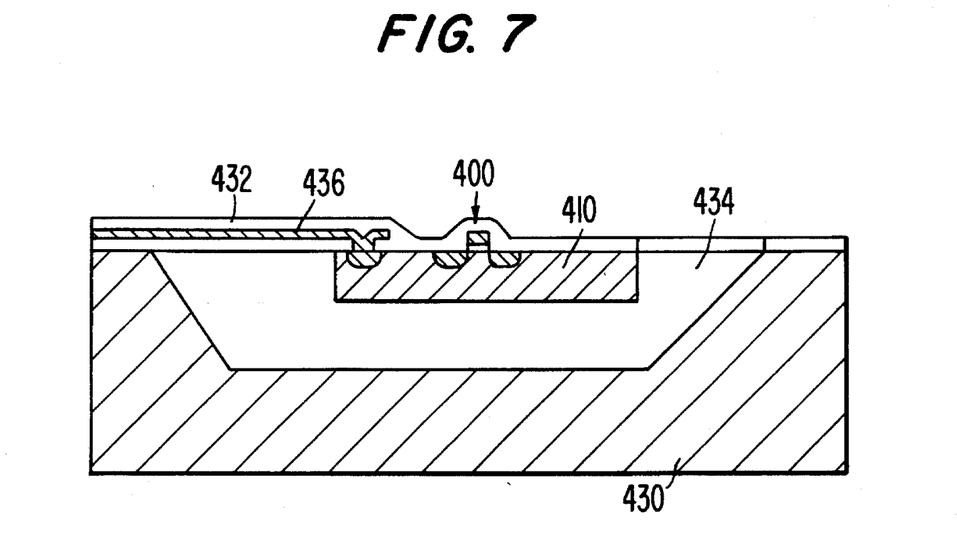
FIG. 7 is a cross-sectional view of the structure of FIG. 6.

For efficient heating, the reference circuitry should be insulated from the substrate, minimizing heat conduction losses. To accomplish this, an electrochemical etch technique, as described in greater detail elsewhere herein, selectively etches exposed regions of the p-type silicon substrate 430, leaving n-wells 410a–c, suspended from silicon dioxide beams 432 over a pit 434, as shown schematically in FIGS. 6 and 7. Due to the high thermal resistivity of the support beams 432, the circuits 400 in these n-wells 410 are thermally isolated from the substrate. Aluminum traces 436 inside the oxide support beams 432 connect the isolated circuitry to external circuits. This micromachining process is fully CMOS compatible, and can be used at the wafer scale or with bonded pans having exposed metalization.

Figure 8:
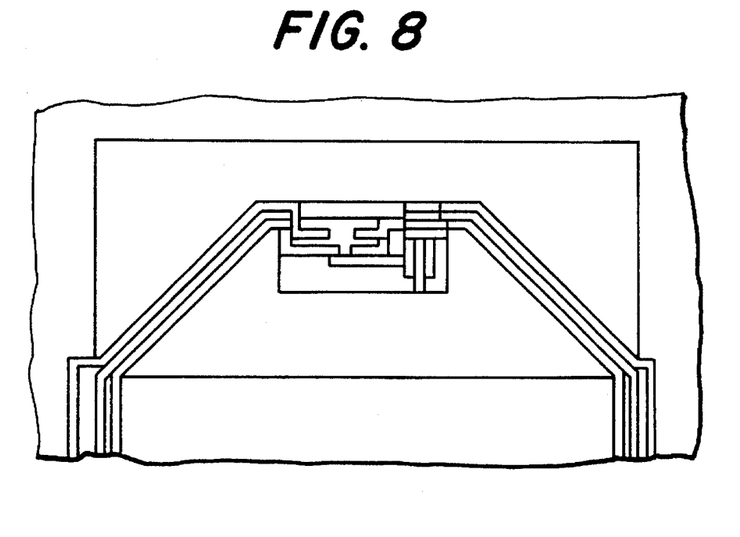
FIG. 8 is an elevational view of a bandgap structure before etching.
Figure 9:
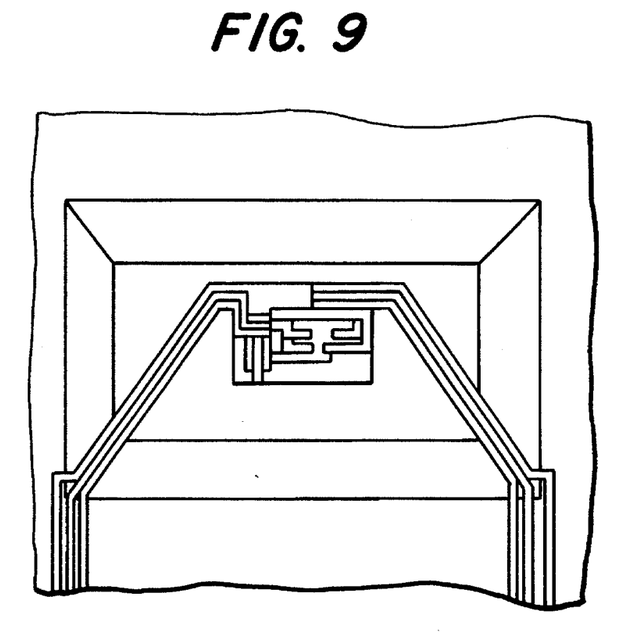
FIG. 9 is an elevational view of the bandgap structure of FIG. 8, after etching in accordance with the invention.

As shown in FIG. 5, the reference core 400 is contained in three n-wells 410a, 410b, and 410c which are closely spaced. The substrate region surrounding these n-wells is exposed silicon realized during the CMOS processing as described above with respect to the thermal transducer, by superimposing cuts in the dielectric layers in the layout (FIG. 8). To etch the exposed substrate and undercut the reference circuitry, the packaged and bonded parts are submerged in an 85° C. solution of 10 wt. % TMAH containing 32 g/l dissolved silicon. To selectively etch the p-type substrate and passivate the n-wells, an electrochemical etch-stop is performed. The three n-wells are biased at 0.8 V above the p-substrate, which is held at −1.6 V relative to a silver/silver chloride reference electrode in the solution. After a three hour etch, the n-wells are completely undercut and left suspended by two silicon dioxide beams (FIG. 9). Due to an etching phenomenon, the thin regions of p-substrate between the n-wells are not etched, thus leaving single-crystal silicon thermal connections among the three n-wells 410a–c. The resistors R1 and R2 are formed by being placed over the n-wells 410a–c in a protective oxide layer. This creates a lumped thermal mass which ensures isothermal operation of the reference circuitry.

The thermal properties of a reference structure as shown in FIG. 5 were measured by heating the reference with the PMOS heater and observing the temperature by measuring the proportional-to-absolute-temperature (PTAT) current of the bandgap cell. The thermal resistance of the experimental structure was found to be 53,000 °C./W, as compared to a typical heated-substrate reference package resistance of 200 °C./W. The higher isolation is attributed to the excellent insulation properties of the thin support beams, accentuated by the fact that they are 180 μm long. The thermal time constant of the structure was measured to be 2.5 ms which is two orders of magnitude faster than previous heated references as described by R. Dobkin, "Monolithic Temperature Stabilized Voltage Reference with 0.5 ppm/° Drift," *ISSCC Digest of Technical Papers*, pp. 108–09 (Feb. 1976) and D. Laude et al., "5 V Temperature Regulated Voltage Reference," *IEEE J. Solid-State Circuits*, Vol. 15, pp. 1070–1075 (December 1980). These thermal characteristics lead to significant reductions in heater power and warm-up time.

Figure 10:
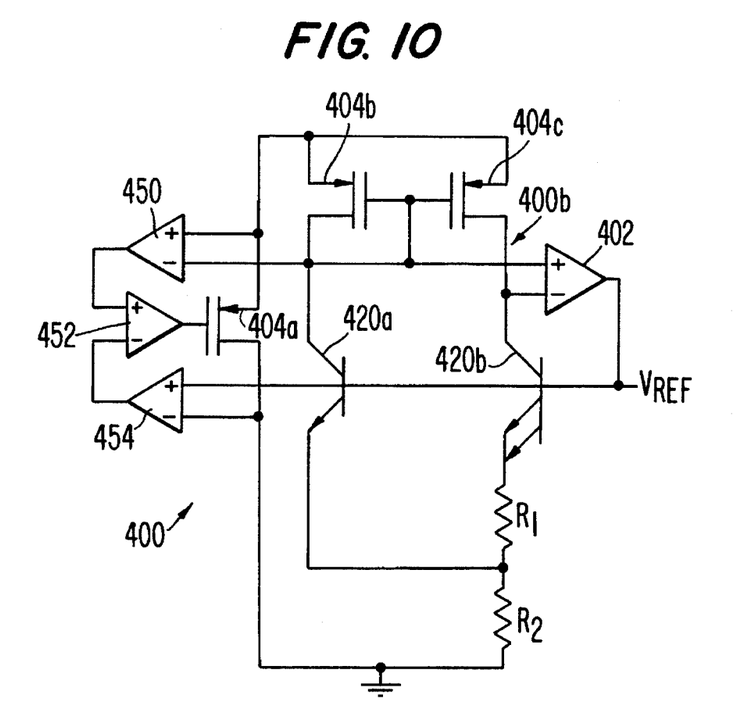
FIG. 10 is the bandgap reference core of FIG. 5 having a closed loop control circuit added to stabilize the temperature of the suspended bandgap core.

To regulate the temperature of the thermally isolated voltage reference, a closed loop control circuit as shown in FIG. 10 was made with external amplifiers 450, 452, and 454. As will be appreciated by those of skill in the art, alternatively, the control circuitry can be integrated along with the reference cell. The base-emitter voltage $V_{BE}$ of the transistor 420a varies inversely with the resistor voltage $V_{R2}$ as a function of temperature, so that the reference output voltage $V_{REF}$, which equals $V_{BE}+V_{R2}$, is fairly stable. As the temperature of the reference increases, the PTAT current in the reference cell goes up, increasing the $V_{GS}$ of the PMOS transistor 404b, which is output by the amplifier 450. This temperature dependent voltage is compared to a scaled version of the reference output voltage $V_{REF}$, which is output by the amplifier 454, and used to drive the PMOS heater transistor 404a, thus regulating the temperature of the reference. The voltages $V_{GS}$ and scaled $V_{REF}$ are compared by the amplifier 452, the output of which drives the heater transistor 404a. Alternatively, the PTAT current can be mirrored, passed through a resistor and directly compared to the reference voltage.

Figure 11:
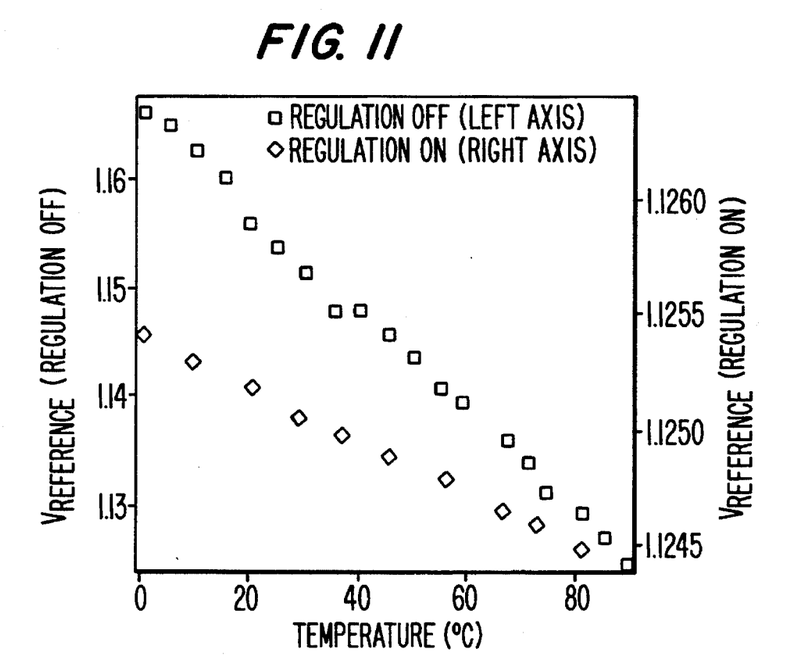
FIG. 11 is a graph showing measurement of the output voltage drift of the circuit of FIG. 10, measured from 0° C. to 80° C. with the heater off and with the heater regulating the temperature at 90° C.

The output voltage drift of an experimental part was measured from 0° C. to 80° C. with the heater off and with the heater regulating the temperature at 90° C. The results of these measurements are shown in FIG. 11. The unregulated temperature coefficient was 400 ppm/°C. With closed loop temperature control, the temperature coefficient dropped to 9 ppm/°C. By improving the open-loop performance of the reference, the temperature coefficient can be greatly reduced, approaching the performance of commercial heated-substrate references.

Combined with on-chip control amplifiers, the micromachined bandgap provides a high-performance, monolithic, temperature-regulated voltage reference for low-power applications. The performance is limited by the offset drift of the on-chip amplifiers, but this can be minimized by chopper stabilization or by including portions of the amplifier on the temperature-controlled membrane. Since the circuit is realized in a standard CMOS process and requires a small die area (100 mils$^2$), the reference can be included on the same chip with converters and other circuitry. Due to the low temperature coefficient of the reference, only a single trim would be required to adjust the absolute output voltage, obviating the complex trims used in curvature corrected references. In addition, packaging stress induced drift errors will be minimized by the regulated nature of the reference and by the fact that the reference circuitry is not in physical contact with the bulk substrate.

Modifications and variations of the above-described embodiments of the present invention are possible, as appreciated by those skilled in the art in light of the above teachings. It is therefore to be understood that, within the scope of the appended claims and their equivalents, the invention may be practiced otherwise than as specifically described.

What is claimed is:

1. An integrated circuit incorporating a suspended single crystal silicon structure, comprising:

a p-substrate;

a pit etched in said p-substrate;

at least one dielectric beam extending over said pit;

an n-well suspended over said pit by said at least one dielectric beam, said at least one dielectric beam providing mechanical support and thermal insulation of said n-well;

circuitry having electrical characteristics effected by temperature, at least a portion of said circuitry being located in said n-well and being thermally isolated in said n-well; and electrically conductive traces in said at least one dielectric beam connecting said thermally isolated circuitry to external circuits.

2. The device of claim 1, wherein said electrically conductive traces are aluminum.

3. The device of claim 1, wherein said circuitry comprises an MOS heating transistor for controlling the temperature in said n-well.

4. The device of claim 1, wherein said circuitry comprises a heating resistor for controlling the temperature in said n-well.

5. The device of claim 1, wherein said circuitry comprises a temperature sensor including at least one diode.

6. The device of claim 1, wherein said circuitry comprises a temperature sensor including at least one MOS transistor.

7. The device of claim 1, wherein said circuitry comprises a temperature sensor including at least one bipolar transistor.

8. The device of claim 1, wherein said circuitry comprises a temperature sensor including at least one temperature-sensitive resistor.

9. The device of claim 1, wherein said circuitry comprises a feedback mechanism including a heating transistor and a diode, said heating transistor acting as an actuator, said diode acting as a temperature sensor, and said feedback mechanism acting to keep said circuitry at a substantially constant temperature.

* * * * *

UNITED STATES PATENT AND TRADEMARK OFFICE
CERTIFICATE OF CORRECTION

PATENT NO. : 5,600,174
DATED : Feb. 4, 1997
INVENTOR(S) : Richard J. Reay, et al It is certified that error appears in the above-identified patent and that said Letters Patent is hereby corrected as shown below:

In col. 1 of the specification, after the title and prior to the heading "BACKGROUND OF THE INVENTION", please insert the following:

--This invention was made with Government support under contracts N00014-93-L-0759 and N00014-92-J-1940 awarded by the Office of Naval Research and contract ECS58289 awarded by the National Science Foundation. The Government has certain rights in this invention.--

Signed and Sealed this

First Day of December, 1998

*Attest:*

BRUCE LEHMAN

*Attesting Officer*         *Commissioner of Patents and Trademarks*